United States Patent [19]

Gibbons

[11] 4,434,318
[45] * Feb. 28, 1984

[54] SOLAR CELLS AND METHOD

[75] Inventor: James F. Gibbons, Palo Alto, Calif.

[73] Assignee: Sera Solar Corporation, Santa Clara, Calif.

[*] Notice: The portion of the term of this patent subsequent to May 26, 1998 has been disclaimed.

[21] Appl. No.: 247,611

[22] Filed: Mar. 25, 1981

[51] Int. Cl.³ .................... H01L 31/06; H01L 31/18
[52] U.S. Cl. .................... 136/258; 136/259; 148/1.5; 148/174; 29/572; 357/30
[58] Field of Search ............. 136/258 PC; 258 AM, 136/259; 357/2, 30 J, 30 K; 427/74, 39, 86; 148/1.5, 174; 29/572

[56] References Cited

U.S. PATENT DOCUMENTS

| 4,064,521 | 12/1977 | Carlson | 357/2 |
| 4,253,882 | 3/1981 | Dalal | 136/249 |
| 4,270,018 | 5/1981 | Gibbons | 136/258 |
| 4,292,461 | 9/1981 | Hovel | 136/249 |

Primary Examiner—Aaron Weisstuch
Attorney, Agent, or Firm—Flehr, Hohbach, Test, Albritton & Herbert

[57] ABSTRACT

A solar cell having a solar absorbing layer of truly amorphous or microcrystalline semiconductor material or mixture thereof with means cooperating with said layer for collecting carriers generated by the solar energy. Said solar cell also including means for causing the solar energy to twice pass through the solar energy absorbing layer.

9 Claims, 17 Drawing Figures

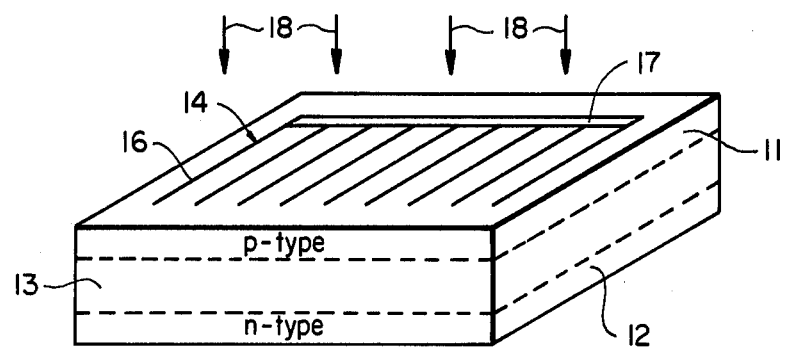
FIG__1
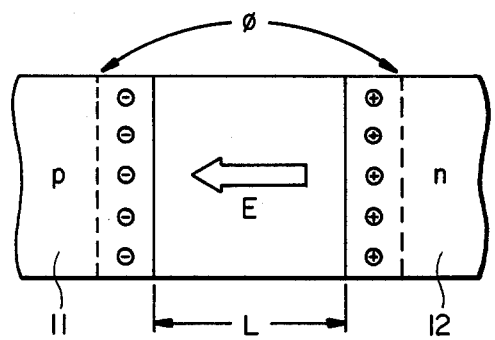
FIG__2
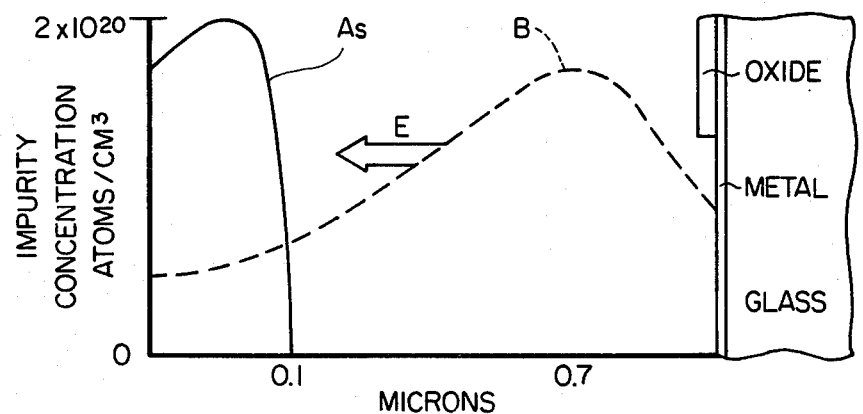
FIG__9

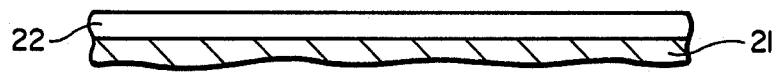
FIG_3A
FIG_3B
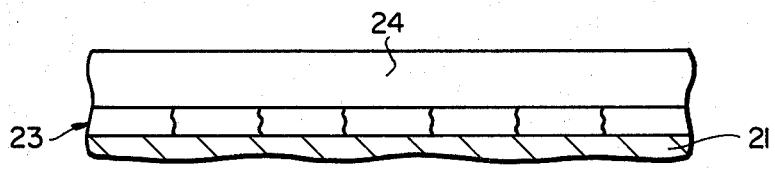
FIG_3C
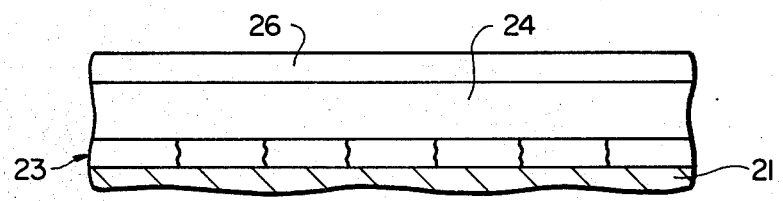
FIG_3D
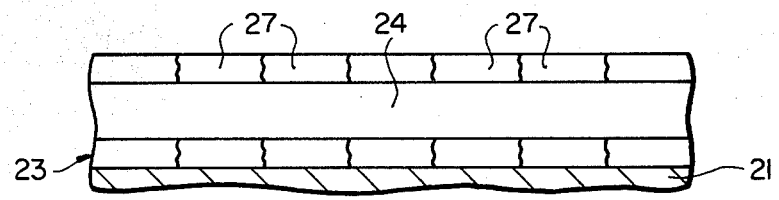
FIG_3E

FIG_4A
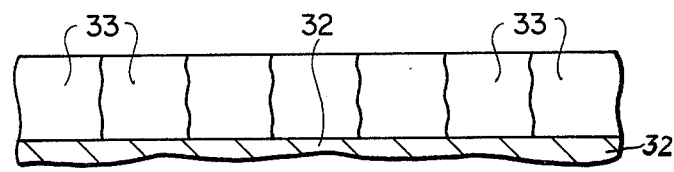
FIG_4B
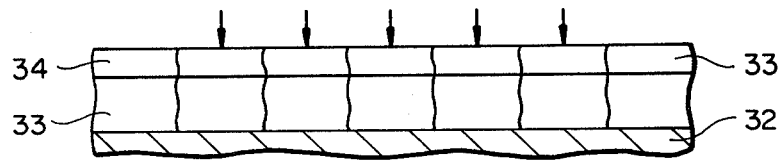
FIG_4C
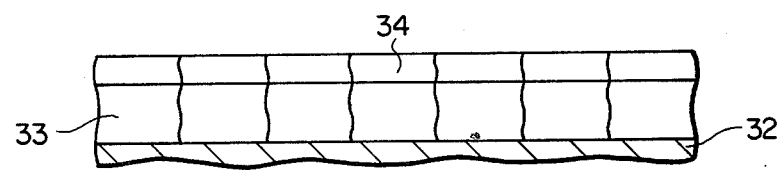
FIG_4D
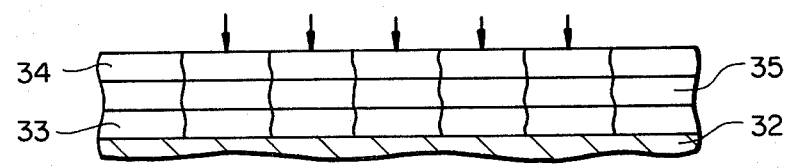
FIG_4E

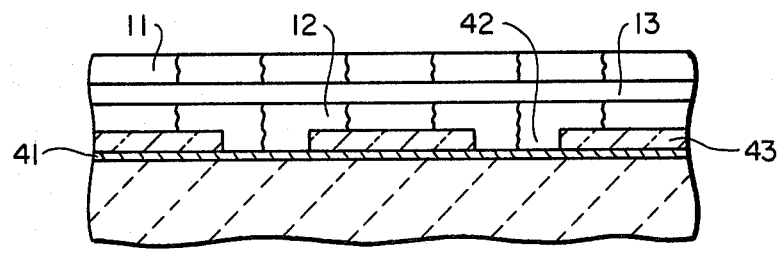
FIG_5
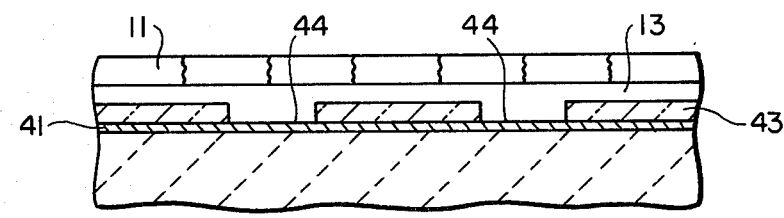
FIG_6
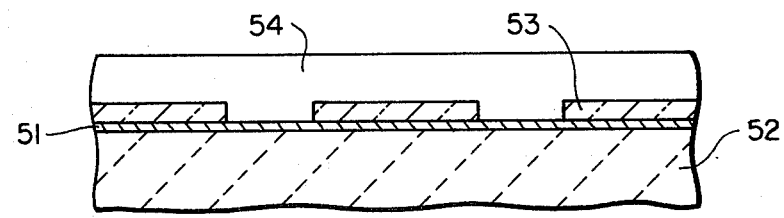
FIG_7
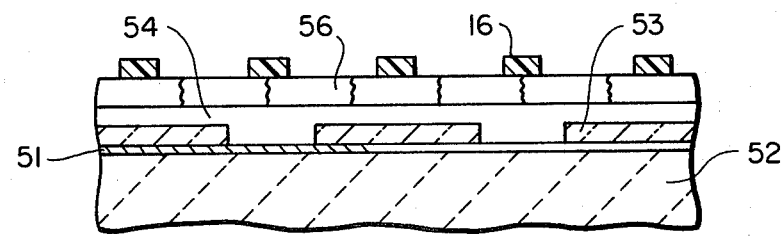
FIG_8

SOLAR CELLS AND METHOD

This application is a continuation-in-part of copending application Ser. No. 107,437, filed Dec. 26, 1979, now U.S. Pat. No. 4,270,018.

The term of this patent subsequent to May 26, 1998 is disclaimed.

This invention relates generally to solar cells made of semiconductor material and more particularly to such cells including amorphous semiconductor material.

For photons with energy near the band edge ($h\nu \sim E_g$), crystalline silicon is a relatively poor photon absorber because electronic transitions from the valence band to the conduction band are forbidden, absent some form of disorder. While lattice vibrations result in some transitions, the photon absorption due to this effect proves to be relatively small, and therefore solar cells made from crystalline silicon need to be relatively thick. However, disorder within the crystal permits electronic transitions to occur with relatively high probability and thus increases the optical absorption coefficient appreciably. In fact substantial photon absorption is possible at photon energies well below $E_g$, given sufficient disorder.

The disorder that leads to increased absorption occurs in both truly amorphous silicon or other semiconductor material and microcrystalline silicon or other semiconductor material in which the grain size is on the order of a few hundred angstroms. Disorder that increases the optical absorption substantially can also be produced by ion-implantation in a single crystal. In what follows, we use the term "truly amorphous" material to encompass all of these structures. Even though a particular material structure is described in the examples to follow, the operation is the same regardless of energy absorbing structure.

Because of their high absorbance, both truly amorphous and microcrystalline silicon are materials of great potential and interest for solar cell applications. This interest arises from the fact that truly amorphous silicon or microcrystalline silicon or mixtures thereof are highly efficient absorbers of solar energy and are at the same time extremely easy and cheap to prepare. The optical absorption characteristics are such that a thin layer of amorphous silicon will absorb as much solar energy as a 250 $\mu$m thick layer of crystalline silicone. Hence, the use of truly amorphous or microcrystalline silicon or mixture thereof as an optical absorber leads to the use of significantly less material than that required for a single crystal cell.

Amorphous silicon layers are also impressively inexpensive. They can be obtained by RF plasma deposition from a silane-based ($SiCl_4$) gaseous source or by either sputtering or evaporation of silicon from either silicon powder or a charge of polycrystalline material, followed by an appropriate heating cycle. Microcrystalline silicon can also be made by low pressure chemical vapor deposition techniques, and the degree of disorder can be increased if necessary by ion implantation. The RF deposition process is of special interest because it is simple to add dopants during the deposition process. Thus, p-type, n-type and intrinsic layers can be grown during one deposition run by appropriate control of the gases admitted to the plasma deposition chamber.

However, truly amorphous or microcrystalline silicon cells made by any of the techniques described above are typically of very low efficiency. The reason for this is that the carrier lifetime in the amorphous layer is very short and, hence, the collection of electrons and holes from such a layer is difficult.

It is an object of the present invention to provide a solar cell including a collector layer of truly amorphous or microcrystalline semiconductor material having a high collection efficiency for holes and electrons generated in the layer and to a method of making the solar cell.

It is a further object of the present invention to provide a highly efficient, inexpensive solar cell and method of making the solar cell.

It is a further object of the present invention to provide a solar cell including a collecting layer of truly amorphous or microcrystalline semiconductor material or a mixture thereof in which the solar energy impinges on the solar cell, travels through the collecting layer and is then reflected back through the layer to increase the energy collecting efficiency.

These and other objects are achieved by a solar cell which includes n-type and p-type polycrystalline or single crystal layers separated by a truly amorphous or microcrystalline layer of semiconductor material or mixture thereof.

Other objects are achieved by a solar cell which includes n-type and p-type polycrystalline or microcrystalline layers separated by an amorphous layer of semiconductor material or mixture thereof and a reflecting layer for reflecting solar energy transmitted through the amorphous layer back through the layer, and to a method of making the solar cell.

FIG. 1 is a perspective view of a solar cell in accordance with the present invention.

FIG. 2 is a partial sectional view showing the accelerating voltage across the amorphous semiconductive collector layer.

FIGS. 3 A-E show the steps for one method of forming a solar cell in accordance with the present invention.

FIGS. 4 A-E show the steps for another method of forming a solar cell in accordance with the present invention.

FIG. 5 shows a solar cell in accordance with the present invention having improved solar energy collecting capability.

FIG. 6 shows another solar cell in accordance with the present invention.

FIG. 7 shows an intermediate step in forming a solar cell in accordance with another embodiment of the invention.

FIG. 8 shows the completed solar cell of FIG. 7.

FIG. 9 shows the impurity concentration profile across the cell of FIG. 8.

Referring to FIG. 1, the solar cell comprises a first layer 11 spaced from a second layer 12 by a collecting layer 13 of amorphous material. Layers 11 and 12 may, for example, be single crystal or polycrystalline semiconductor material. One of the layers is p-type and the other n-type. The amorphous layer may be an intrinsic layer. Suitable contacts 14 may be formed on the upper surface. The contacts may be in the form of a comb with relatively narrow and long teeth 16 and a wide back 17 whereby to provide for maximum penetration of solar energy into the cell, as shown by the rays 18. The layer 12 includes an ohmic contact whereby the electrical energy generated in the amorphous material between the p-type and n-type layers by carriers formed by the impinging solar energy can be recovered.

The amorphous layer 13 serves as the optically active region in which the solar energy is absorbed and the carriers are generated. The absorption properties and thickness of the collecting layer are such that it will absorb substantially all of the solar energy that strikes the cell. Referring to FIG. 2, the contact potential that normally develops across a p-n or a p-i-n junction is shown between the doped layers 11 and 12. For the purpose of this example, one assumes that the holes that leave the p-type region to form the space charge layer in the p-type material recombine with the electrons in the amorphous layer, namely the electrons coming from the n-type region. Thus, the amorphous layer is sandwiched between p-type and n-type semiconductive layers that are either single crystal or sufficiently large grain polycrystalline material to permit the development of space charge in the normal manner for a p-i-n junction. The two space charge layers shown in FIG. 2 produce an electric field in the intrinsic amorphous or microcrystalline layer whose value is $E=\phi/L$.

As an example, for $\phi=0.7$ volts and $L=0.5$ μm, one obtains $E=14,000$ volts/cm, a rather large field. With this field, carriers that are generated in the amorphous layer can drift to the crystalline contact layers in a time $$\tau = L^2/\mu\phi$$

where $\mu$ is the carrier mobility. Taking the value of $\mu$ of 5 cm$^2$/V-sec as representative of typical carrier mobilites in an amorphous silicon film, one finds the transit time across the amorphous layer to be $$\tau \cong 0.7 \text{ ns}$$

Hence, a substantial fraction of the photogenerated carriers can be collected so long as the carrier lifetime is 1 ns or more. Without this electric field, however, the transit time would be governed by the carrier diffusion length for 1 ns lifetime which would be $$l_D \cong 0.14 \text{ μm}.$$

Hence, carriers generated in most of the amorphous layer cannot be collected into the contact regions without the presence of the electric field. However, the electric field offers a technique so that most of the carriers generated in the amorphous region are collected even when the carrier lifetime is so short that diffusion transport cannot possibly provide an efficient means for transporting carriers to the collecting layers. It is apparent that the better the transport properties, such as carrier mobility, the more efficient the carrier collection and more efficient the cell. The carrier mobility is believed to be somewhat improved with microcrystalline material for the layer 13.

It is also possible to use an amorphous layer of one material, germanium, and a collecting layer of another material, silicon. In addition, dopant can be added to the amorphous layer while it is being grown to produce a graded impurity profile in the amorphous layer. This procedure provides an extended drift field in the amorphous layer according to U.S. Pat. No. 4,001,864 which aids the transport of carriers along the amorphous layers in the manner therein described.

FIG. 3 illustrates the steps for one process for forming a solar cell in accordance with one embodiment of the present invention. Starting with a graphite or other suitable substrate 21, an amorphous or microcrystalline layer 22 of material is grown on the substrate by plasma deposition, FIG. 3A. The amorphous silicon may be doped with arsenic to form n-type material. Thereafter, a continuous wave laser or electron beam can be scanned over the layer 22 to recrystallize the layer into large grain polycrystalline silicon illustrated schematically by the crystals 23, FIG. 3B. For example, the laser beam may be generated by a Spectra Physics Model 171 argon ion laser with power output of 15 watts focused onto a 40 micrometer spot scanned over the amorphous silicon layer at a speed of 10 centimeters per second. Next, the recrystallized n-type layer is used as a base on which a truly amorphous or microcrystalline layer 24 of intrinsic silicon can be grown. The amorphous layer may be 0.50 μm layer 26, FIG. 3D. The microcrystalline layer may also be formed by low pressure chemical vapor deposition techniques to have optical properties similar to amorphous silicon and carrier mobilities in the range 5–25 cm$^2$/V-sec. Thereafter, a continuous wave laser operating at a power level of approximately 5 watts with other conditions as described above melts only the top 0.25 μm layer of the deposited amorphous film. This recrystallizes the layer 26 containing the p-type dopant to form large grain crystals 27, FIG. 3E. In this way, n-type and p-type layers are formed with high quality large grain polycrystalline material with a layer of intrinsic truly amorphous or microcrystalline silicon separating the polycrystalline layers. Ohmic contacts can be made, for example, by forming comblike contacts on the upper surface by masking and evaporation or suppering and forming a lower contact layer by evaporation or sputtering.

An alternative method for fabricating a solar cell according to the present invention is described with reference to FIG. 4. Here a thin layer 31 of arsenic-doped amorphous silicon is deposited on a steel or graphite substrate 32, FIG. 4A. The material is then recrystallized by scanning with a laser beam as described above to produce large grain n-type crystallites 33, FIG. 4B. The recrystallization may also be carried out with an electron beam or other suitable means which produce crystals which extend between the two surfaces.

Next, a heavily doped p-type layer (p++) 34 is made directly in the n-type material by implanting boron, FIG. 4C, and using a CW laser or electron beam to anneal the implantation damage under conditions that produce substantially no diffusion of the implanted boron, FIG. 4D. By an appropriate choice of implantation conditions, the (p++-n) junction can be formed at approximately 0.1 μm beneath the surface.

Next, fluorine or other light ions are implanted at a dose and energy that will produce a buried amorphous layer 35, FIG. 4E. For example, implantation of fluorine at a dose of $5 \times 10^{14}$/CM$^2$ at an energy of 100 keV followed by a second fluorine implantation at a dose of $5 \times 10^{14}$/CM$^2$, at an energy of 200 keV will succeed in amorphizing the polycrystalline silicon. The amorphous layer will start at approximately 0.1 μm and continue to a depth of approximately 0.4 μm. In this way, we obtain p+ and n+ polycrystalline layers separated by an amorphous region as required in the present invention. Furthermore, by implanting fluorine we introduce a species which tends to attach to silicon to reduce dangling bonds in the implantation-amorphized layer, thus improving the carrier lifetime in the amorphous layer.

As a third alternative, it would be possible to start with n-doped metallurgical grade single crystal or polycrystalline silicon substrate (wafers) obtained by casting, film growth (EFG) or conventional Czochralski techniques. The steps outlined in FIGS. 4 C–E can then be performed to produce the p++ -n junction and the buried amorphous layer.

The transit time of carriers can be reduced by making the amorphous layer 13 or 35 thinner. Referring to FIG. 5, there is shown a solar cell in which the solar absorbing layer 13 is thinner while having substantially the same solar absorbing characteristics. Before forming the cell in the manner above described, the substrate is provided with a thin, highly reflective metal film 41 by suitable thin film techniques such as sputtering or evaporation.

The surface of the metal is coated with a patterned oxide coating. This coating can be formed by well known chemical vapor deposition techniques and then masked and etched to leave exposed metal areas 42 and oxide coated areas 43. The oxide coated areas protect the reflective film and maintain its reflecting properties. The exposed metal film areas serve as the back contact for the solar cell. The cell can then be formed to provide layers 11, 12 and 13 in the manner previously described. The oxide-coated metal reflects the solar energy so that it passes back through the amorphous layer 13, thus causing the solar energy to pass through the collecting layer two times. This permits thinner solar absorbing layers 13 and gives a factor of approximately four improvement in transit time.

By proper selection of the metal film it can form either a rectifying or ohmic contact 44, with the layer 13. If the metal forms a rectifying contact to p-type material, for example, then layer 12 can be eliminated. Layer 13 is then lightly doped p-type and layer 11 is n-type, preferably heavily doped to reduce series resistance. Such a solar cell is shown in FIG. 6.

FIGS. 7 and 8 show another method of fabricating a solar cell of the type shown in FIG. 6. The solar cell is formed by first depositing a reflective metal base 51 on a glass substrate 52. The surface of the metal is coated with an oxide layer, masked and etched as described above to provide oxide coated areas 53. The next step is to deposit an undoped layer of silicon 54 on the upper surface. The layer may be approximately one micron thick and formed by low pressure chemical vapor deposition techniques. The next step is to implant arsenic (As) to about 100 KV at a dose of $10^{15}/CM^2$ followed by a boron (B) implant at 300 KV at a dose of $10^{15}/CM^2$. This produces a doping as illustrated in FIG. 9. There is a doping gradient in the silicon layer which produces a field E. The implantation tends to drive the layer 54 amorphous or fine grain microcrystalline improving its absorption properties. The upper surface of the arsenic layer is then crystallized to provide the upper layer 56 resulting in the device shown in FIG. 8. The upper contacts are shown at 16.

There has been provided a solar cell which includes a center region which is highly absorbent to the solar energy to thereby generate carriers which are quickly removed by the built-in voltage between the n-type and p-type layers. Preferably the amorphous layer includes a gradient whereby to further enhance the collection of the generated carriers. By using a reflective back contact the collecting efficiency is increased.

The recrystallized p and n layers also offer substantially less resistance to current flow through the doped films to the comb contact fingers than amorphous layers. This leads to reduced power loss within the cell compared to a situation wherein no recrystallization has been performed.

What is claimed is:

1. A solar cell comprising n-type and p-type silicon single crystal or polycrystalline collecting semiconductor layers separated by a truly amorphous semiconductor layer that serves as a layer which absorbs the optical energy and generates carriers.

2. A solar cell comprising n-type and p-type silicon single crystal or polycrystalline collecting semiconductor layers separated by a microcrystalline semiconductor layer that serves as a layer which absorbs the optical energy and generates carriers.

3. A method of fabricating a solar cell comprising the steps of forming a single crystal or polycrystalline layer of semiconductor material of one conductivity type, forming a layer of amorphous semiconductor material on the layer of said one conductivity type, and forming a single crystal or polycrystalline layer of semiconductor material of opposite conductivity type on the other surface of the amorphous semiconductor layer.

4. The method of claim 3 wherein the step of forming an amorphous layer comprises the step of forming a truly amorphous layer.

5. The method of claim 3 wherein the step of forming an amorphous layer comprises the step of forming a microcrystalline layer.

6. The method of fabricating a solar cell as in claim 5 in which said microcrystalline layer is formed by chemical vapor deposition.

7. The method of fabricating a solar cell as in claim 3 in which such amorphous layer is formed by plasma deposition.

8. The method of fabricating a solar cell as in claim 3 in which said amorphous layer is formed by ion implantation.

9. A solar cell including a solar absorbing layer of semiconductor material selected to be amorphous, microcrystalline or mixed amorphous and microcrystalline semiconductor material, a transparent layer of polycrystalline semiconductor material of one conductivity type contiguous with one surface of said solar energy absorbing layer, a layer of polycrystalline semiconductor material of opposite conductivity type contiguous with the other surface of said solar energy absorbing layer and a metal reflecting film contiguous with said layer of opposite conductivity type to form ohmic contact therewith and serving to reflect transmitted solar energy back through the solar energy absorbing layer.

* * * * *